(12) United States Patent
Sun

(10) Patent No.: US 12,261,083 B2
(45) Date of Patent: Mar. 25, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventor: Chia-Chen Sun, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 407 days.

(21) Appl. No.: 17/740,377

(22) Filed: May 10, 2022

(65) Prior Publication Data
US 2023/0326792 A1   Oct. 12, 2023

(30) Foreign Application Priority Data

Apr. 8, 2022   (CN) .......................... 202210367306.5

(51) Int. Cl.
*H01L 21/768* (2006.01)
*H01L 23/522* (2006.01)

(52) U.S. Cl.
CPC .. *H01L 21/76897* (2013.01); *H01L 21/76831* (2013.01); *H01L 23/5226* (2013.01)

(58) Field of Classification Search
CPC ............. H01L 21/76897; H01L 21/768; H01L 21/76831; H01L 21/76805; H01L 21/76895; H01L 21/823475; H01L 21/8234; H01L 23/5226; H01L 23/522; H01L 23/585; H01L 23/60; H01L 23/62; H01L 23/64; H01L 23/66; H01L 23/58; H01L 23/481; H01L 23/48; H01L 27/088; H01L 27/14665; H01L 27/14643; H01L 27/14607; H01L 27/146
See application file for complete search history.

(56) References Cited

U.S. PATENT DOCUMENTS

| | | | |
|---|---|---|---|
| 7,960,821 B2 | 6/2011 | Chen et al. | |
| 9,466,730 B2 * | 10/2016 | Kumar | H01L 21/02252 |
| 9,991,126 B2 | 6/2018 | Park et al. | |
| 2015/0206966 A1 * | 7/2015 | Kumar | H01L 29/40114 438/257 |

* cited by examiner

*Primary Examiner* — Nikolay K Yushin
(74) *Attorney, Agent, or Firm* — Winston Hsu

(57) ABSTRACT

A method for fabricating a semiconductor device includes the steps of first forming an active device having a gate structure and a source/drain region on a substrate, forming an interlayer dielectric (ILD) layer on the active device, removing part of the ILD layer to form a contact hole on the active device without exposing the active device and the bottom surface of the contact hole is higher than a top surface of the gate structure, and then forming a metal layer in the contact holt to form a floating contact plug.

18 Claims, 5 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method of forming floating contact plug on an active device.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of poly-gate or high-k metal transistor, it has been observed that whether gate structures being active gates or dummy gates, contact plugs are formed in the later stage to connect to the gate structures or source/drain region and the design of current contact plugs is likely to induce a conduction in the original dummy gate thereby causing failure to the entire circuit. Hence, how to resolve this issue has become an important task in this field.

SUMMARY OF THE INVENTION

According to an embodiment of the present invention, a method for fabricating a semiconductor device includes the steps of first forming an active device having a gate structure and a source/drain region on a substrate, forming an interlayer dielectric (ILD) layer on the active device, removing part of the ILD layer to form a contact hole on the active device without exposing the active device and the bottom surface of the contact hole is higher than a top surface of the gate structure, and then forming a metal layer in the contact holt to form a floating contact plug.

According to another aspect of the present invention, a semiconductor device includes an active device on a substrate, an interlayer dielectric (ILD) layer on the gate structure, and a floating contact plug in the ILD layer and directly on the active device. Preferably, the floating contact plug includes a first portion and a second portion on the active device.

According to yet another aspect of the present invention, a semiconductor device includes an active device on a substrate, an interlayer dielectric (ILD) layer on the gate structure, and a floating contact plug in the ILD layer and directly on the active device. Preferably, a top surface of the floating contact plug includes a circle.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
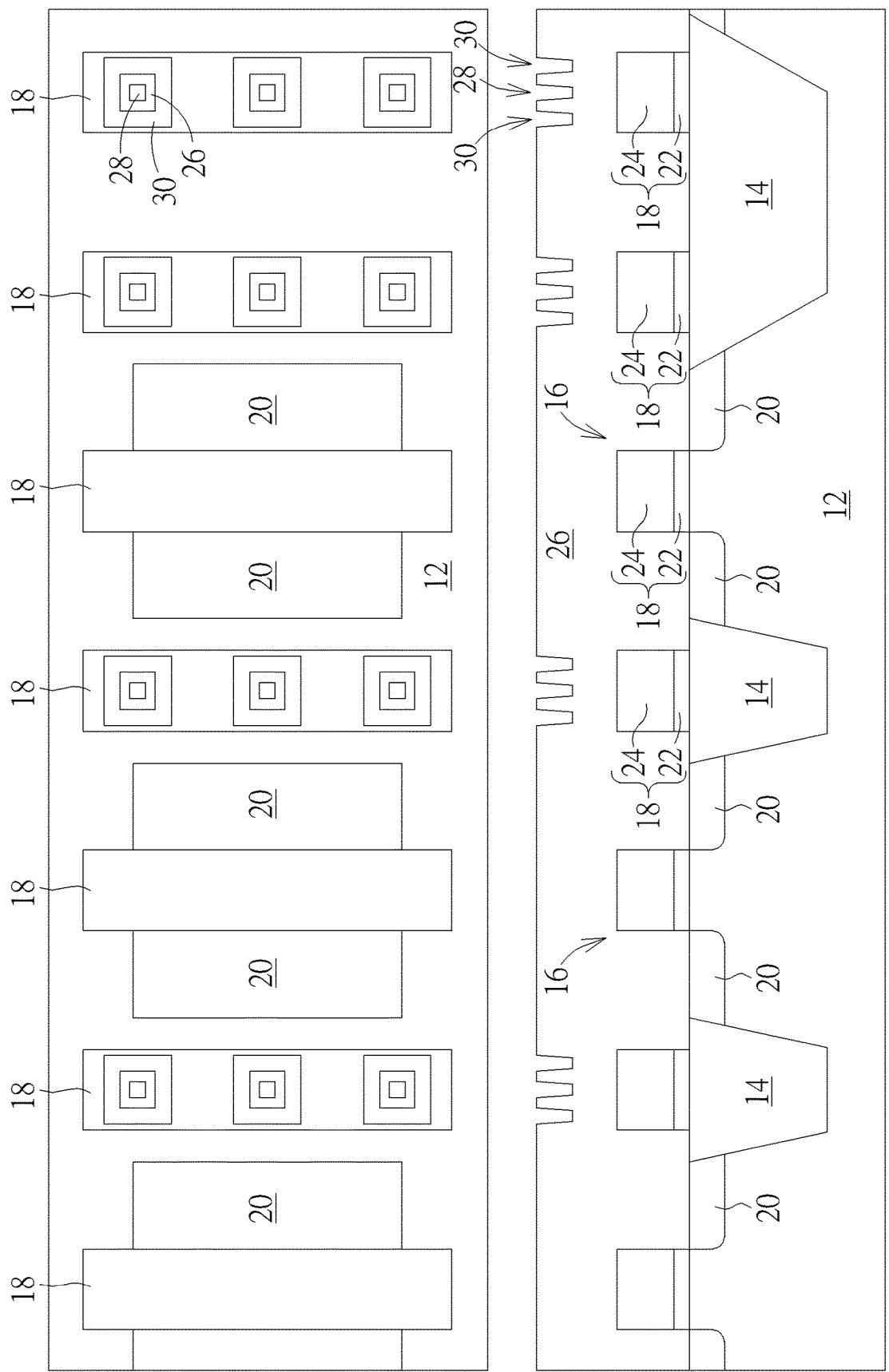
FIGS. 1-2 illustrate a method for fabricating a semiconductor device according to an embodiment of the present invention.
Figure 2:
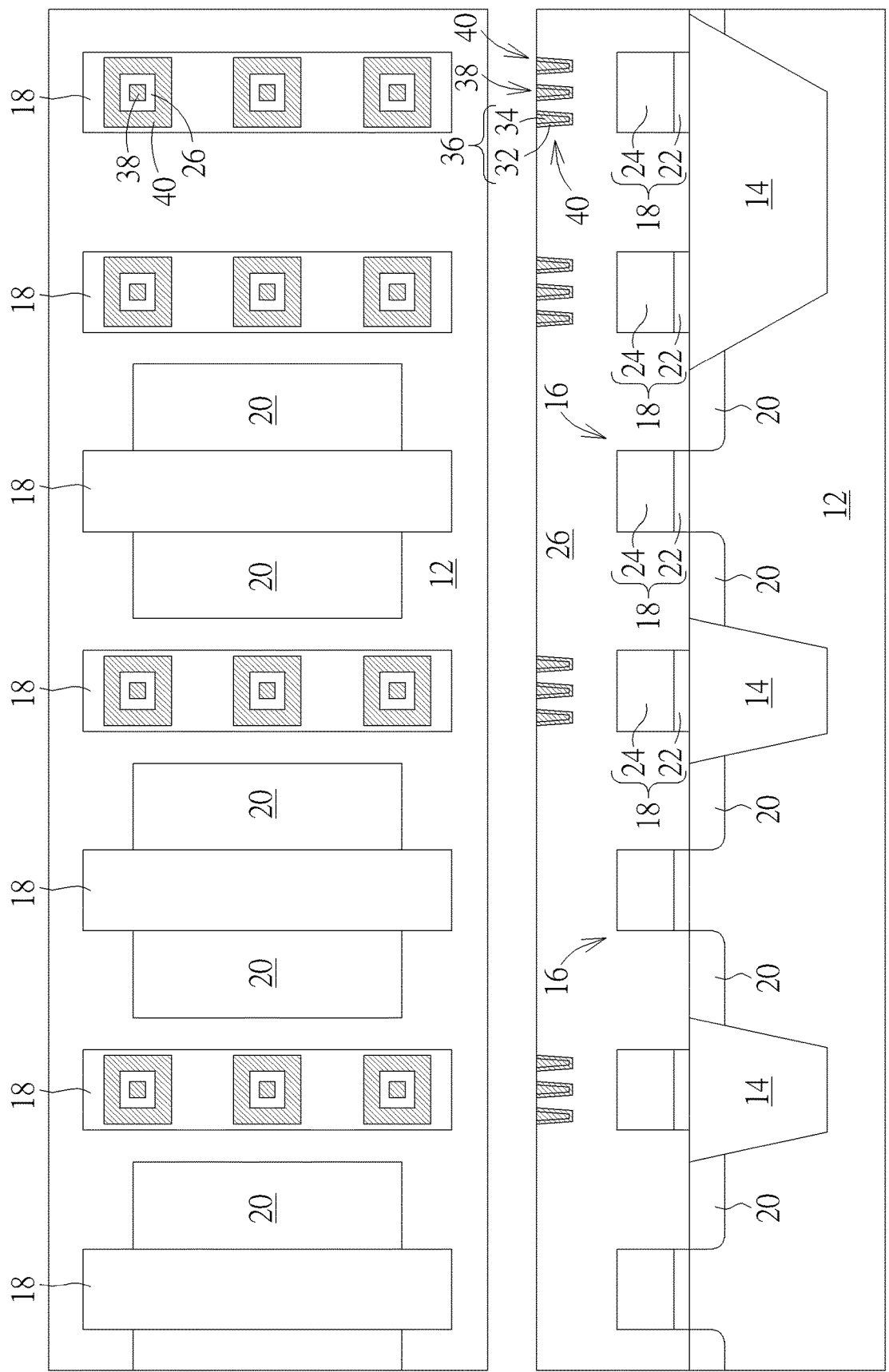

Referring to FIGS. 1-2, FIGS. 1-2 illustrate a method for fabricating a semiconductor device according to an embodiment of the present invention, in which the bottom portion of each figure illustrates a cross-section view for fabricating the semiconductor device and the top portion of each figure illustrates a top-view perspective for fabricating the semiconductor device. As shown in FIG. 1, a substrate 12 is first provided, in which the substrate 12 is a semiconductor substrate made of semiconductor material including but not limited to for example silicon, germanium, silicon-germanium compounds, silicon carbide, or gallium arsenide. Next, a shallow trench isolation (STI) 14 made of silicon oxide is formed in the substrate 12 and active devices such as metal-oxide semiconductor (MOS) transistors 16 and a dielectric layer such as an interlayer dielectric (ILD) layer 26 is formed to cover the active devices. Specifically, planar or non-planar (such as FinFET) devices could be formed on the substrate 12, in which the MOS transistors 16 could include gate structure elements such as gate structures 18 on the substrate 12, spacers (not shown) adjacent to the gate structures 18, source/drain regions 20 in the substrate 12 adjacent to two sides of the gate structures 18, and selective epitaxial layer and/or silicides disposed on the surface of the source/drain regions 20.

In this embodiment, each of the gate structures 18 could include a gate dielectric layer 22 and a gate electrode 24, in which the gate dielectric layer 22 preferably includes silicon oxide and the gate electrode 24 could include polysilicon or metal. It should be noted that even though the gate structures 18 include gate electrodes 24 made of polysilicon in this embodiment, according to other embodiments of the present invention it would also be desirable to conduct a replacement metal gate (RMG) process to transform the polysilicon gate structures 18 into metal gates including work function metal layers, which is also within the scope of the present invention. Since the approach of using the RMG process to transform polysilicon gates into metal gates are well known to those skilled in the art, the details of which are not explained herein for the sake of brevity.

Preferably, the spacer could be a single spacer or a composite spacer. For instance, the spacer could further include an offset spacer (not shown) and a main spacer (not shown) and the spacer could be selected from the group consisting of $SiO_2$, SiN, SiON, and SiCN. The source/drain region 20 and epitaxial layer could include different dopants or different material depending on the type of transistor being fabricated. For instance, the source/drain region 20 could include p-type or n-type dopants and the epitaxial layer could include SiGe, SiC, or SiP. In this embodiment, the ILD layer 26 could be made of silicon oxide, the ILD layer 26 could be disposed on the substrate 12 to cover the MOS transistors 16, and the a plurality of contact plugs (not shown) could be disposed in the ILD layer 26 to electrically connect the source/drain regions 20.

Next, a photo-etching process is conducted by first forming a patterned mask (not shown) such as patterned resist on the ILD layer 26 while exposing the top surface of part of the ILD layer 26, and then conducting an etching process by using the patterned mask as mask to remove part of the ILD layer 26 for forming contact holes 28, 30 directly on top of the gate structures 18 and/or source/drain regions 20. Preferably, the contact holes 28, 30 are formed without exposing the top surface of the gate structures 18 and the bottom surface of the contact holes 28, 30 is slightly higher than the top surface of the gate structures 18.

It should be noted that if viewed under a top view perspective as shown in the top portion of FIG. 1, the contact holes 28, 30 preferably includes a contact hole 28 disposed in the center and a ring-shaped contact hole 30 surrounding the contact hole 28 while the ILD layer 26 is disposed in the middle to separate the two contact holes 28, 30. If viewed under a cross-section perspective as shown in the bottom portion of FIG. 1, the contact holes 28, 30 formed after the aforementioned photo-etching process preferably includes a contact hole 28 in the middle and two contact holes 30 adjacent to two sides of the contact hole 28, the bottom surface of the contact holes 28, 30 is higher than the top surface of the gate structures 18, and all three contact holes 28, 30 are disposed directly above the gate structures 18 or if viewed from another perspective the leftmost and rightmost sidewalls of the contact holes 30 on two adjacent sides are aligned with or not exceeding the two sidewalls of each gate structure 18.

Next, as shown in FIG. 2, conductive materials including a barrier layer 32 selected from the group consisting of titanium (Ti), titanium nitride (TiN), tantalum (Ta), and tantalum nitride (TaN) and a metal layer 34 selected from the group consisting of tungsten (W), copper (Cu), aluminum (Al), titanium aluminide (TiAl), and cobalt tungsten phosphide (CoWP) are deposited into the contact holes 28, 30, and a planarizing process such as chemical mechanical polishing (CMP) process is conducted to remove part of aforementioned barrier layer 32 and metal layer 34 for forming floating contact plugs 36 directly on top of each gate structure 18.

It should be noted that since the conductive materials are deposited into the contact holes 28, 30 shown in FIG. 1 for forming the floating contact holes 36, the floating contact holes 36 formed at this stage whether being viewed under a top view perspective or cross-section perspective would share same pattern as the contact holes 28, 30 shown in FIG. 1. For instance, if viewed under a top view perspective as shown in the top portion of FIG. 2, the floating contact plug 36 includes an inner portion 38 disposed in the center and an outer portion 40 surrounding the inner portion 38 as the ILD layer 26 is disposed therebetween to separate the inner portion 38 and the outer portion 40. If viewed under a cross-section perspective as shown in the bottom portion of FIG. 2, the floating contact plug 36 after being filled with conductive materials including the barrier layer 32 and metal layer 34 preferably includes an inner portion 38 in the middle and two outer portions 40 adjacent to two sides of the inner portion 38, in which the bottom surface of the inner portion 38 is even with the bottom surface of the outer portions 40, and both the inner portion 38 and the outer portions 40 are disposed directly on top or overlapping the gate structures 18 or if viewed from another perspective the outermost sidewalls of the outer portions 40 are aligned with or not surpassing the two sidewalls of each gate structure 18.

According to an embodiment of the present invention, the distance between the top surface of the gate structures 18 and bottom surface of the floating contact plug 36 could be slightly less than, equal to, or greater than the overall height of each of the floating contact plugs 36 and if the distance between the top surface of the gate structures 18 and the bottom surface of the floating contact plugs were to be greater than the overall height of each floating contact plug 36, the distance between the top surface of the gate structures 18 and the bottom surface of the floating contact plugs 36 could be twice or three times the overall height of each of the floating contact plugs 36. It should further be noted that there is no additional element such as conductors, metals, or metal interconnections between the floating contact plugs 36 and the gate structures 18 except the ILD layer 26. In other words, the bottom surface of the floating contact plugs 36 only contact the dielectric material including the ILD layer 26 without contacting any other conductive material directly.

Next, it would be desirable to conduct a metal interconnective process by first forming an inter-metal dielectric (IMD) layer on the floating contact plugs 36 and then forming metal interconnections (not shown) in the 1 MB layer, in which the metal interconnections if viewed under a cross-section perspective could directly contact or not contacting the top surface of floating contact plugs 36, which are all within the scope of the present invention. This completes the fabrication of a semiconductor device according to an embodiment of the present invention.

Figure 3:
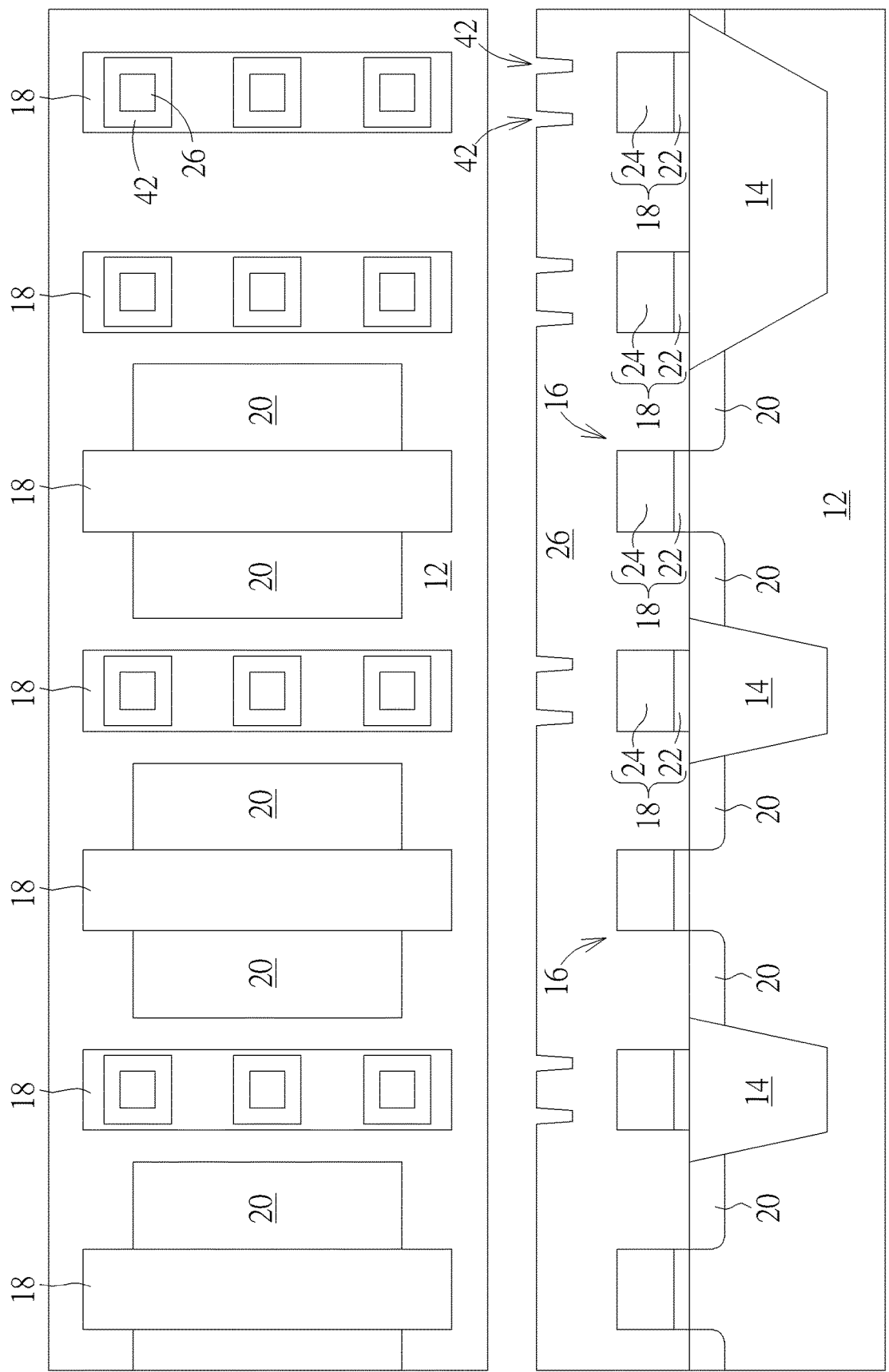
FIGS. 3-4 illustrate a method for fabricating a semiconductor device according to an embodiment of the present invention.
Figure 4:
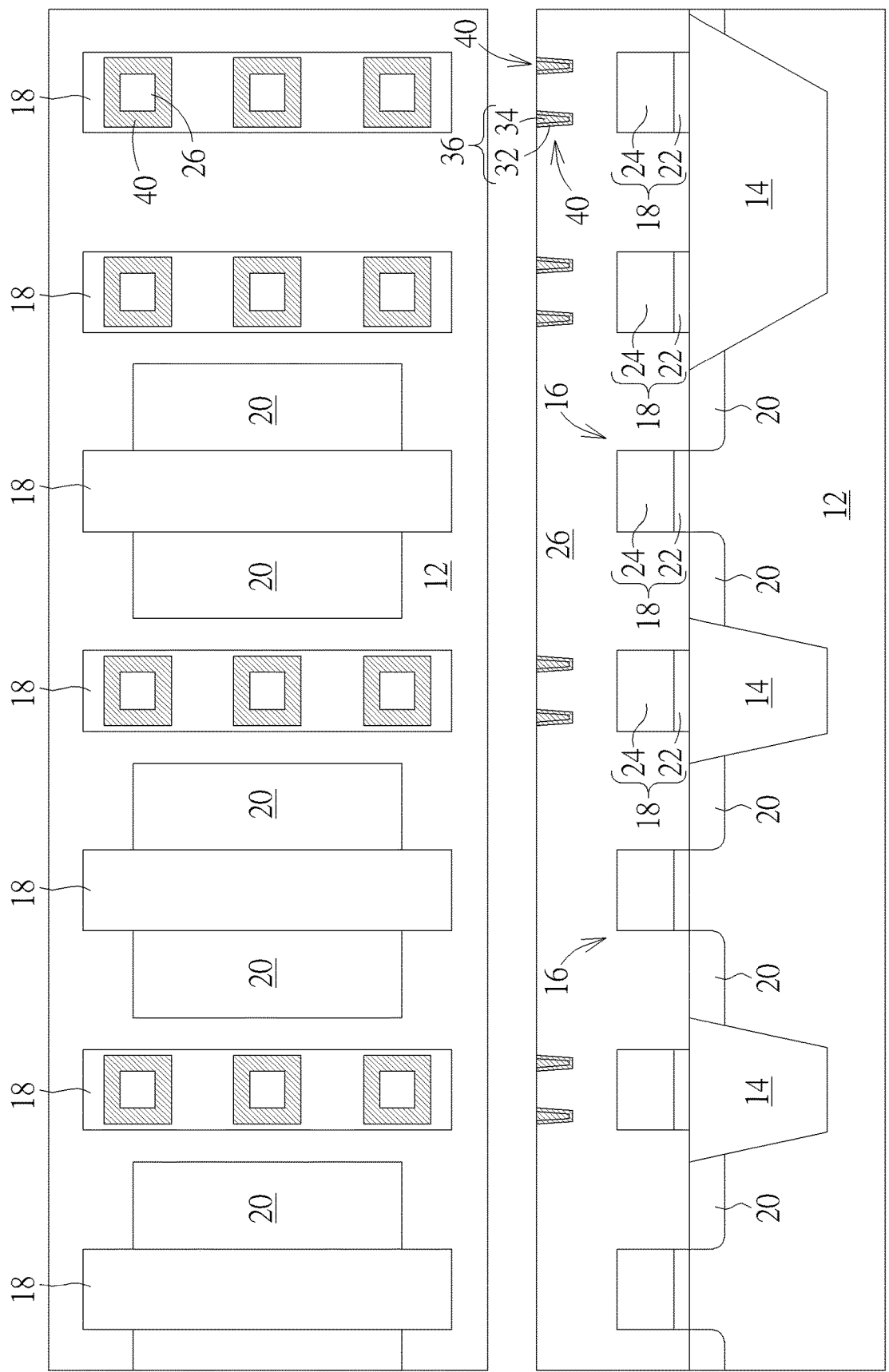

Referring to FIGS. 3-4, FIGS. 3-4 illustrate a method for fabricating a semiconductor device according to an embodiment of the present invention, in which the bottom portion of each figure illustrates a cross-section view for fabricating the semiconductor device and the top portion of each figure illustrates a top-view perspective for fabricating the semiconductor device. As shown in FIG. 3, it would be desirable to first form active devices such as MOS transistors 16 on the substrate 12 as shown in FIG. 1 and ILD layer 26 covering the MOS transistors 16, and then conducting a photo-etching process to remove part of the ILD layer 26 for forming contact holes 42 directly on top of the gate structures 18 and/or source/drain regions 20. Preferably, the contact holes 42 are formed without exposing the top surface of the gate structures 18 and the bottom surface of the contact holes 42 is slightly higher than the top surface of the gate structures 18.

In contrast to the contact holes 28, 30 if viewed under a top view perspective include a contact hole 28 disposed in the center and a ring-shaped contact hole 30 surrounding the contact hole 28 as shown in FIG. 1, the contact hole 42 in this embodiment if viewed under a top view perspective as shown in FIG. 3 only include a ring-shape contact hole 42 surrounding the ILD layer 26 in the center. If viewed under a cross-section perspective as shown in the bottom portion of FIG. 3, the contact hole 42 preferably includes two contact holes 42 overlapping each of the gate structures 18, in which the bottom surface of the contact holes 42 is higher than the top surface of the gate structures 18 and the two contact holes 42 are disposed directly on top of each gate structure 18 or if viewed from another perspective, the left sidewall of the left contact hole 42 and the right sidewall of the right contact hole 42 are both aligned with or not surpassing the two sidewalls of each of the gate structures 18 underneath.

Next, as shown in FIG. 4, conductive materials including a barrier layer 32 selected from the group consisting of titanium (Ti), titanium nitride (TiN), tantalum (Ta), and tantalum nitride (TaN) and a metal layer 34 selected from the group consisting of tungsten (W), copper (Cu), aluminum (Al), titanium aluminide (TiAl), and cobalt tungsten phosphide (CoWP) are deposited into the contact holes 42, and a planarizing process such as chemical mechanical polishing (CMP) process is conducted to remove part of aforementioned barrier layer 32 and metal layer 34 for forming floating contact plugs 36 directly on top of each gate structure 18.

Similar to the aforementioned embodiment, since the conductive materials are deposited into the contact holes 42 shown in FIG. 3 for forming the floating contact holes 36, the floating contact holes 36 formed at this stage whether being viewed under a top view perspective or cross-section perspective would share same pattern as the contact holes 42 shown in FIG. 3. For instance, if viewed under a top view perspective as shown in the top portion of FIG. 4, the floating contact plug 36 includes an outer portion 40 surrounding the ILD layer 26 in the center. If viewed under a cross-section perspective as shown in the bottom portion of FIG. 4, the floating contact plug 36 after being filled with conductive materials including the barrier layer 32 and metal layer 34 preferably includes two outer portions 40, in which the bottom surfaces of the two outer portions 40 are coplanar and both the two outer portions 40 are disposed directly on top or overlapping the gate structures 18 or if viewed from another perspective, the left sidewall of the left portion 40 and the right sidewall of the right portion 40 are both aligned with or not surpassing the two sidewalls of each of the gate structures 18 underneath.

Moreover, according to an embodiment of the present invention, the distance between the top surface of the gate structures 18 and bottom surface of each floating contact plug 36 could be slightly less than, equal to, or greater than the overall height of each of the floating contact plugs 36 and if the distance between the top surface of the gate structures 18 and the bottom surface of the floating contact plugs were to be greater than the overall height of each floating contact plug 36, the distance between the top surface of the gate structures 18 and the bottom surface of the floating contact plugs 36 could be twice or three times the overall height of each of the floating contact plugs 36. It should further be noted that there is no additional element such as conductors, metals, or metal interconnections between the floating contact plugs 36 and the gate structures 18 except the ILD layer 26. In other words, the bottom surface of the floating contact plugs 36 only contact the dielectric material including the ILD layer 26 without contacting any other conductive material directly.

Next, it would be desirable to conduct a metal interconnective process by first forming an inter-metal dielectric (IMD) layer on the floating contact plugs 36 and then forming metal interconnections (not shown) in the IMD layer, in which the metal interconnections if viewed under a cross-section perspective could directly contact or not contacting the top surface of floating contact plugs 36, which are all within the scope of the present invention. This completes the fabrication of a semiconductor device according to an embodiment of the present invention.

Figure 5:
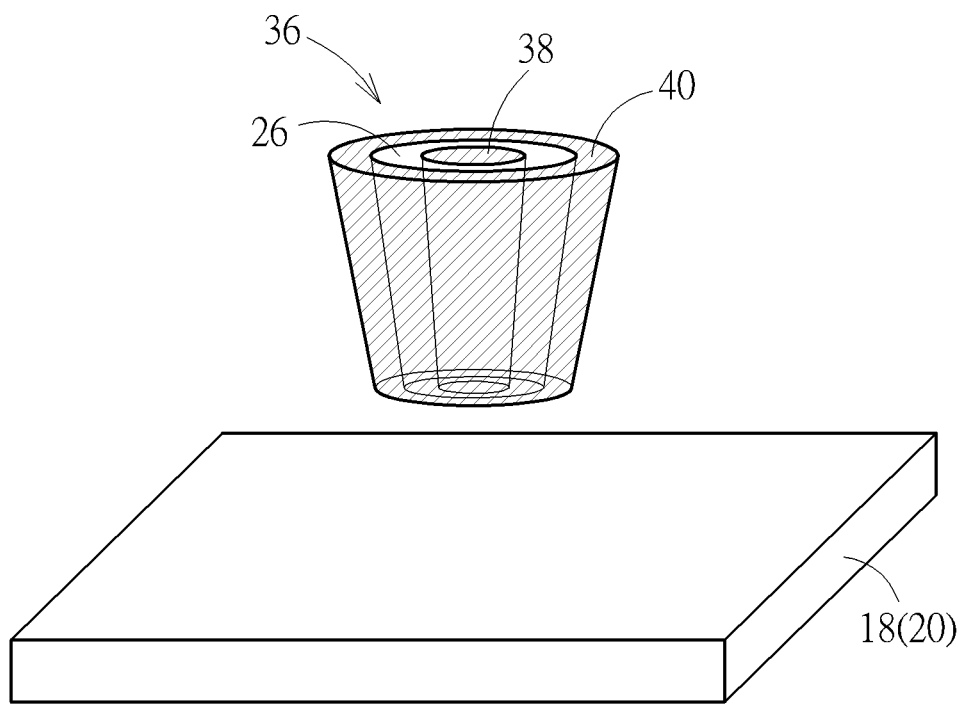
FIG. 5 illustrates a 3-dimensional view of a floating contact plug fabricating from FIGS. 1-2 according to an embodiment of the present invention.

Referring to FIG. 5, FIG. 5 illustrates a 3-dimensional view of a floating contact plug 36 fabricating from FIGS. 1-2 according to an embodiment of the present invention. As shown in FIG. 5, in contrast to the floating contact plugs 36 shown in FIG. 1 were represented by rectangles, it would also be desirable to first conduct the photo-etching process shown in FIGS. 1-2 by forming contact holes and depositing conductive materials into the contact holes for forming floating contact plugs 36 and during the photo-etching process, adjust the pattern of the mask or conduct a calibrating procedure such as an optical proximity correction (OPC) process so that the resulting floating contact plug 36 reveals a substantially columnar or cone shape with circular top and bottom surfaces.

Preferably, the floating contact plug 36 includes an inner portion 38 and an outer portion 40 surrounding the inner portion 38, the top surface of the inner portion 38 if viewed under a top view perspective includes a solid circle, and the top surface of the outer portion 40 if viewed under a top view perspective includes a circular ring. Similarly, the bottom surface of the inner portion 38 if viewed under a top view perspective includes a solid circle and the bottom surface of the outer portion 40 if viewed under a top view perspective includes a circular ring. Preferably, the area, size, diameter, and/or radius of the bottom surface of the inner portion 38 is less than the area, size, diameter, and/or radius of the corresponding top surface of the inner portion 38, and the area, size, diameter, and/or radius of the bottom surface of the outer portion 40 is also less than the area, size, diameter, and/or radius of the corresponding top surface of the outer portion 40.

Figure 6:
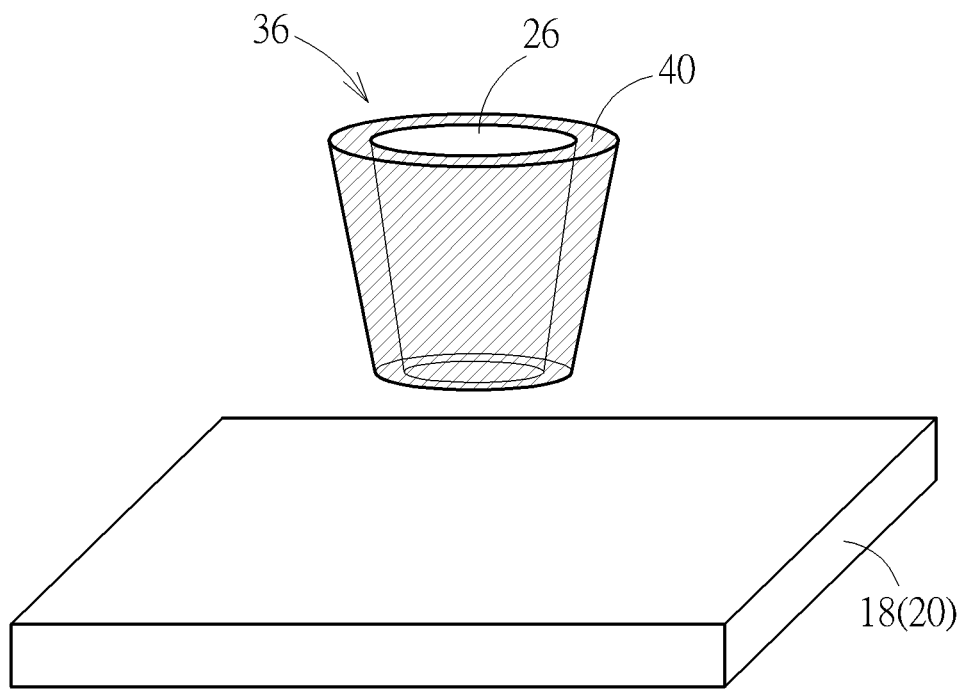
FIG. 6 illustrates a 3-dimensional view of a floating contact plug fabricating from FIGS. 3-4 according to an embodiment of the present invention.

Referring to FIG. 6, FIG. 6 illustrates a 3-dimensional view of a floating contact plug 36 fabricating from FIGS. 3-4 according to an embodiment of the present invention. As shown in FIG. 6, it would also be desirable to first conduct the photo-etching process shown in FIGS. 3-4 by forming contact holes and depositing conductive materials into the contact holes for forming floating contact plugs 36 and during the photo-etching process, adjust the pattern of the mask or conduct a calibrating procedure such as an optical proximity correction (OPC) process so that the resulting floating contact plug 36 has a substantially columnar or cone shape. Preferably, the floating contact plug 36 could be disposed directly on top of the gate structure 18 and/or source/drain region 20, and the body of the floating contact plug 36 includes a ring-shape outer portion 40 surrounding the ILD layer 26 in the center. Similar to FIG. 5, the area, size, or diameter/radius of the bottom surface of the outer portion 40 of floating contact plug 26 in this embodiment is slightly less than the area, size, or diameter/radius of the top surface of the outer portion 40.

Overall, it has been observed that in current fabrication of poly-gate or high-k metal transistor whether gate structures being active gates or dummy gates, contact plugs are formed in the later stage to connect to the gate structures or source/drain region and this design often induces a conduction in the original dummy gate thereby causing failure to the entire circuit. To resolve this issue, the present invention carries out the same fabrication for forming contact plugs directly on top of the gate structures and/or source/drain regions while replacing the contact plugs that are originally formed to penetrate the ILD layer and directly contact gate structures and/or source/drain regions with floating contact plugs. Preferably, the bottom surface of the floating contact plugs is higher than the top surface of the gate structures and no other conductive elements such as metal wirings are disposed between the gate structures and the floating contact plugs except the ILD layer. By using this design, it would be desirable to maintain the density of the contact plugs, provide a much more balanced stress, and reduce loading effect caused during CHIP process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   forming an active device on a substrate, wherein the active device comprises:
   a gate structure comprising:
   a gate dielectric layer on the substrate;
   a gate electrode on the gate dielectric layer;
   a source/drain region adjacent to two sides of the gate electrode; and
   forming a floating contact plug directly on the gate electrode.

2. The method of claim 1, wherein a top view of the floating contact plug comprises a ring.

3. The method of claim 1, wherein the floating contact plug comprises:
   an inner portion; and
   an outer portion surrounding the inner portion.

4. The method of claim 3, wherein a top view of the inner portion comprises a solid circle and the outer portion comprises a ring.

5. The method of claim 1, further comprising:
   forming an interlayer dielectric (ILD) layer on the gate structure;
   removing part of the ILD layer to form a contact hole on the active device, wherein a bottom surface of the contact hole is higher than a top surface of the gate structure;
   forming a metal layer in the contact hole for forming the floating contact plug.

6. The method of claim 5, further comprising forming the contact hole directly on the gate structure.

7. The method of claim 5, further comprising forming the contact hole directly on the source/drain region.

8. A semiconductor device, comprising:
   an active device on a substrate, wherein the active device comprises:
   a gate structure comprising:
   a gate dielectric layer on the substrate;
   a gate electrode on the gate dielectric layer;
   a source/drain region adjacent to two sides of the gate electrode;
   an interlayer dielectric (ILD) layer on the gate structure; and
   a floating contact plug in the ILD layer and directly on the gate electrode, wherein the floating contact plug comprises a first portion and a second portion on the active device.

9. The semiconductor device of claim 8, wherein a bottom surface of the floating contact plug contacts the ILD layer directly.

10. The semiconductor device of claim 8, wherein the first portion and the second portion overlap the gate structure.

11. The semiconductor device of claim 8, wherein bottom surfaces of the first portion and the second portion are coplanar.

12. The semiconductor device of claim 8, further comprising a third portion between the first portion and the second portion.

13. The semiconductor device of claim 12, wherein the first portion, the second portion, and the third portion overlap the active device.

14. A semiconductor device, comprising:
   an active device on a substrate, wherein the active device comprises:
   a gate structure comprising:
   a gate dielectric layer on the substrate;
   a gate electrode on the gate dielectric layer;
   a source/drain region adjacent to two sides of the gate electrode;
   an interlayer dielectric (ILD) layer on the gate structure; and
   a floating contact plug in the ILD layer and directly on the gate electrode, wherein a top surface of the floating contact plug comprises a circle.

15. The semiconductor device of claim 14, wherein the floating contact plug comprises:
   an inner portion; and
   an outer portion surrounding the inner portion.

16. The semiconductor device of claim 15, wherein a top view of the inner portion comprises a solid circle and the outer portion comprises a ring.

17. The semiconductor device of claim 14, wherein a top view of the floating contact plug comprises a first ring.

18. The semiconductor device of claim 17, wherein a bottom view of the floating contact plug comprises a second ring, wherein the second ring is smaller than the first ring.

* * * * *